(12) United States Patent
Scheer et al.

(10) Patent No.: US 8,946,059 B2
(45) Date of Patent: Feb. 3, 2015

(54) METHOD AND INSTALLATION FOR PRODUCING A SEMICONDUCTOR DEVICE, AND SEMICONDUCTOR DEVICE

(75) Inventors: Evelyn Scheer, Stockstadt (DE); Fabio Pieralisi, Aschaffenburg (DE); Marcus Bender, Hanau (DE)

(73) Assignee: Applied Materials, Inc., Santa Clara, CA (US)

( * ) Notice: Subject to any disclaimer, the term of this patent is extended or adjusted under 35 U.S.C. 154(b) by 1093 days.

(21) Appl. No.: 12/603,352

(22) Filed: Oct. 21, 2009

(65) Prior Publication Data
US 2011/0089559 A1    Apr. 21, 2011

(30) Foreign Application Priority Data
Oct. 15, 2009  (EP) ..................... 09173116

(51) Int. Cl.
| | |
|---|---|
| *H01L 21/20* | (2006.01) |
| *H01L 29/45* | (2006.01) |
| *H01L 21/677* | (2006.01) |
| *H01L 29/49* | (2006.01) |
| *H01L 29/66* | (2006.01) |

(52) U.S. Cl.
CPC .......... *H01L 29/458* (2013.01); *H01L 21/6776* (2013.01); *H01L 29/4908* (2013.01); *H01L 29/66765* (2013.01)
USPC ............ 438/478; 438/597; 438/653; 438/687

(58) Field of Classification Search
CPC ..................... H01L 21/0262; H01L 21/76897; H01L 21/76843
USPC .................................. 438/478, 597, 653, 687
See application file for complete search history.

(56) References Cited

U.S. PATENT DOCUMENTS

| | | | |
|---|---|---|---|
| 5,281,546 | A | 1/1994 | Possin et al. |
| 2007/0002239 | A1 | 1/2007 | Koike |
| 2007/0122649 | A1 | 5/2007 | Lee et al. |
| 2008/0278649 | A1 | 11/2008 | Koike et al. |
| 2008/0315203 | A1 | 12/2008 | Hino et al. |
| 2009/0153056 | A1 | 6/2009 | Chen et al. |
| 2009/0173945 | A1* | 7/2009 | Takasawa et al. ............... 257/66 |

OTHER PUBLICATIONS

International Search Report and Written Opinion dated Dec. 2, 2010 for International Application No. PCT/EP2010/065478.
Office Action dated May 11, 2012 for European Patent Application No. 09173116.6-1528.
EP 09173116.6; Extended European Search Report; Dec. 14, 2009.

* cited by examiner

*Primary Examiner* — Jack Chen
(74) *Attorney, Agent, or Firm* — Patterson & Sheridan, LLP

(57) ABSTRACT

A method of producing a semiconductor device is provided, the semiconductor device including a substrate, a semiconductor layer and at least one metallization layer adjacent to at least one element chosen from the substrate and the semiconductor layer, the method including forming at least one metallization layer which, adjacent to at least one element chosen from the substrate and the semiconductor layer, includes oxygen.

19 Claims, 3 Drawing Sheets

METHOD AND INSTALLATION FOR PRODUCING A SEMICONDUCTOR DEVICE, AND SEMICONDUCTOR DEVICE

TECHNICAL FIELD

Embodiments relate to a method and an installation for producing a semiconductor device, and a semiconductor device. In particular, embodiments relate to a method and an installation for producing a semiconductor device having a metallization, for instance a thin film transistor (TFT) having a Cu metallization.

BACKGROUND ART

A typical bottom-gate staggered thin film transistor can be fabricated by some of the following steps: forming a gate conductor on an upper surface of a transparent substrate; depositing a gate dielectric layer over the gate conductor; depositing a layer of amorphous silicon over the gate dielectric layer; depositing a layer of n+ doped amorphous silicon over the amorphous silicon layer; depositing a layer of source/drain metallization over the n+ doped silicon layer; and patterning the source/drain metallization layer and optionally one or more underlying layers to form respective source and drain electrodes.

Low-resistance TFT metallizations are used e.g. in the manufacture of LCDs for improving the picture quality, the power consumption of the LCDs, and the production cost. For instance copper (Cu), due to its reliability against electromigration and hillock formation, is one of the candidates for replacing aluminum generally used for metallizations.

SUMMARY

In light of the above, a method according to claim 1, a method according to claim 2, a semiconductor device according to claim 12, a semiconductor device according to claim 13, and an installation according to claim 14 are provided.

One embodiment provides a method of producing a semiconductor device including a substrate, a semiconductor layer, and at least one metallization layer adjacent to at least one element chosen from the substrate and the semiconductor layer, the method including forming at least one metallization layer which, adjacent to at least one element chosen from the substrate and the semiconductor layer, includes oxygen.

One embodiment provides a method of producing a semiconductor device including: providing a semiconductor device precursor having a surface; a step including supplying an oxygen containing gas into the chamber and sputtering a first metallization material towards the surface; and a step including terminating the supply of oxygen containing gas and sputtering a second metallization material towards the surface.

According to a further embodiment, a semiconductor device includes a substrate, a semiconductor layer, and at least one metallization layer adjacent to at least one element chosen from the substrate and the semiconductor layer, wherein, adjacent to at least one element chosen from the substrate and the semiconductor layer, one or more of the at least one metallization layers includes oxygen.

According to another embodiment, a semiconductor device is obtainable by a method of producing a semiconductor device, the method including: providing a semiconductor device precursor having a surface; a step including supplying an oxygen containing gas into the chamber and sputtering a first metallization material towards the surface; and a step including terminating the supply of oxygen containing gas and sputtering a second metallization material towards the surface.

According to a further embodiment, an installation for producing a semiconductor device includes a chamber; wherein the chamber includes a coating device adapted to perform a method of producing a semiconductor device including a substrate, a semiconductor layer, and at least one metallization layer adjacent to at least one element chosen from the substrate and the semiconductor layer, the method including forming at least one metallization layer which, adjacent to at least one element chosen from the substrate and the semiconductor layer, includes oxygen.

According to a yet further embodiment, an installation for producing a semiconductor device, includes a chamber; wherein the chamber includes a coating device adapted to perform a method of producing a semiconductor device, the method including: providing a semiconductor device precursor having a surface; a step including supplying an oxygen containing gas into the chamber and sputtering a first metallization material towards the surface; and a step including terminating the supply of oxygen containing gas and sputtering a second metallization material towards the surface.

Further features and details are evident from the dependent claims, the description and the drawings.

Embodiments are also directed to apparatuses for carrying out the disclosed methods and including apparatus parts for performing described method steps. Furthermore, embodiments are also directed to methods by which the described apparatus operates or by which the described apparatus is manufactured. They may include method steps for carrying out functions of the apparatus or manufacturing parts of the apparatus. The method steps may be performed by way of hardware components, firmware, software, a computer programmed by appropriate software, by any combination thereof or in any other manner.

BRIEF DESCRIPTION OF THE DRAWINGS

So that the manner in which the above recited features of embodiments can be understood in detail, a more particular description of embodiments of the invention, briefly summarized above, may be had by reference to examples of embodiments. The accompanying drawings relate to embodiments and are described in the following. Some of the above mentioned embodiments will be described in more detail in the following description of typical embodiments with reference to the following drawings in which.

DETAILED DESCRIPTION OF THE DRAWINGS

Figure 1:
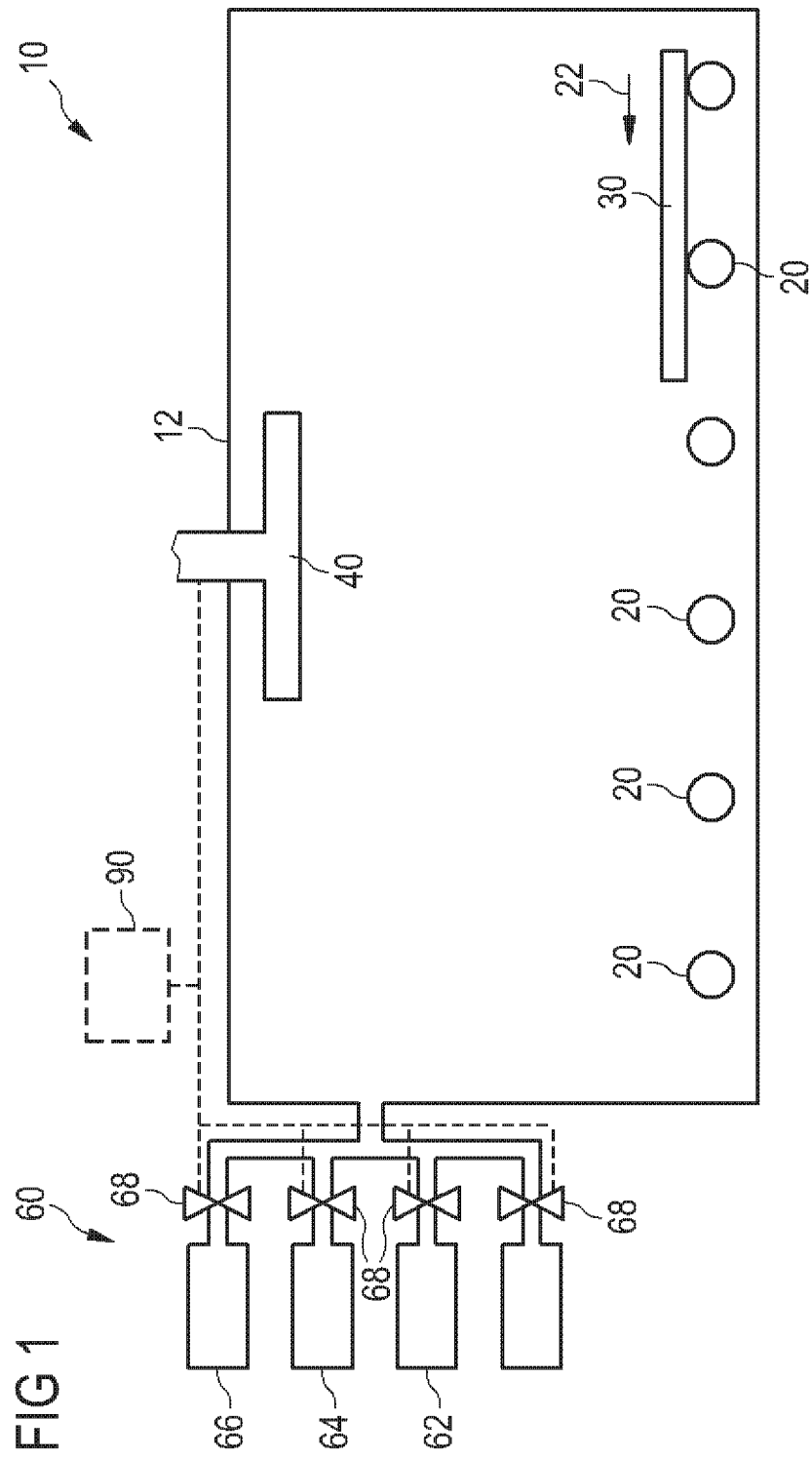
FIG. 1 schematically illustrates an embodiment of an installation for producing a semiconductor device.

Reference will now be made in detail to the various embodiments, one or more examples of which are illustrated in the figures. Each example is provided by way of explanation, and is not meant as a limitation of the invention. It is contemplated that elements of one embodiment may be advantageously utilized in other embodiments without further recitation.

Without limiting the scope, in the following the examples and embodiments are described referring to a bottom-gate staggered TFT as a semiconductor device. However, embodiments described herein can also be applied to other TFT structures, such as a top-gate coplanar TFT, a top-gate staggered TFT, a bottom-gate coplanar TFT, and a TFT having an Etch Stopper Layer (ESL) structure, e.g. a bottom-gate staggered TFT having an Etch Stopper Layer (ESL) structure. Moreover, without limiting the scope, the substrate or intermediates of the semiconductor device will exemplarily be referred to as semiconductor device precursor. Examples of embodiments disclosed herein may also be applied to other types of semiconductor devices than TFT. Moreover, other semiconductors or semiconductor materials than silicon may be contemplated. Embodiments of the installation for producing a semiconductor device include vacuum-compatible materials and the installation may be a vacuum coating installation. Typical applications of embodiments described herein are for example deposition applications in the production of displays, such as LCD, TFT displays and OLED (Organic Light Emitting Diode), in solar wafer manufacturing and in semiconductor device production.

Within the following description of the drawings, the same reference numbers refer to the same components. Generally, only the differences with respect to the individual embodiments are described.

Low-resistance TFT metallizations are used in the manufacture of LCDs for improving the picture quality, the power consumption of the LCDs, and the production cost. For instance refractory metals, such as copper (Cu), are, due to their reliability against electromigration and hillock formation, candidates for replacing the generally used aluminum. The wiring technology using for instance metallizations of pure Cu is affected by three main issues: poor adhesion both on glass and on amorphous semiconductor containing material, such as amorphous silicon, e.g. as gate metallization and drain/source metallization; interdiffusion of metallization material, e.g. Cu, and amorphous semiconductor material, e.g. amorphous silicon; and reactivity of the metallization material with subsequent PECVD, such as a reactivity of Cu with $SiH_4$ of a silicon nitride PECVD. Typically, for counteracting these issues, a combined barrier and adhesion layer, also referred to herein as barrier/adhesion layer, made of molybdenum or titanium is interposed between the layer of pure Cu and the underlying glass or amorphous silicon. This solution results in increased production cost, because of additional material and equipment expenses.

One embodiment provides a method of producing a semiconductor device including a substrate, a semiconductor layer, and at least one metallization layer adjacent to at least one element chosen from the substrate and the semiconductor layer, the method including forming at least one metallization layer which, adjacent to at least one element chosen from the substrate and the semiconductor layer, includes oxygen. In one embodiment, which can be combined with any other embodiment described herein, a step of forming the at least one metallization layer includes at least one step chosen from: forming an oxygen containing barrier/adhesion layer adjacent to at least one element being chosen from a substrate and a semiconductor layer; and forming a metal layer adjacent to the barrier/adhesion layer; wherein the barrier/adhesion layer and the metal layer include at least one metal.

In some embodiments, which can be combined with any other embodiment described herein, the metallization layer includes an oxygen concentration gradient, e.g. an oxygen concentration increasing towards at least one element chosen from the substrate and the semiconductor layer.

A further embodiment provides a method of producing a semiconductor device including: providing a semiconductor device precursor having a surface; a step including supplying an oxygen containing gas into the chamber and sputtering a first metallization material towards the surface; and a step including terminating the supply of oxygen containing gas and sputtering a second metallization material towards the surface.

A yet further embodiment provides a semiconductor device obtainable or obtained by a method of any embodiment described herein.

In another embodiment, an installation including a coating device for performing the method of embodiments described herein is provided. The coating device may include a sputtering device adapted to eject a metallization material, and a supply of an oxygen containing gas. The chamber can include a substrate support facing the coating device and/or the sputtering device, respectively. The substrate support of the installation may include a transport means for continuously and/or discontinuously transporting one or more substrates through the chamber. The substrates can be plate shaped, and the installation and the transport means may be adapted to transport the substrates horizontally or vertically. The installation may include a control device adapted to perform the method of any of the embodiments described herein. The control device may be connected to the sputtering device and/or to the supply of an oxygen containing gas. In some embodiments, the supply of an oxygen containing gas can be controllable, e.g. using valves included in the supply.

Embodiments described herein allow for an improved adhesion of a metallization on a substrate, a semiconductor surface, and/or a dielectric surface of a semiconductor device precursor. For instance, the substrate may be a glass substrate and the semiconductor surface may be an amorphous semiconductor surface, e.g. a-Si surface. Further, interdiffusion of metallization material and an amorphous semiconductor at an interface can be avoided. In addition, a reactivity of deposited metallization material and a PECVD process is reduced or even prevented. These effects are achieved by providing a metallization layer which, adjacent to at least one element chosen from the substrate and the semiconductor layer, includes oxygen. For instance, in some embodiments, a metallization layer, which includes a stack of a metal layer and a barrier/adhesion layer which contains oxygen, is formed on a surface of the semiconductor device precursor, the barrier/adhesion layer being formed adjacent to the surface of the semiconductor device precursor. The surface of the semiconductor device precursor can be a surface of the substrate, a surface of a semiconductor layer, and a surface of a dielectric layer of the semiconductor device precursor.

FIG. 1 schematically illustrates an example of the installation for producing a semiconductor device, according to embodiments. The installation includes a vacuum chamber 10 which can be evacuated by one or more vacuum pumps (not shown). The chamber 10 includes as a substrate support a plurality of transport rolls 20 for continuously or discontinuously transporting a substrate supported thereon. In operation, one or more substrates 30, e.g. plate shaped substrates, can be transported horizontally on the transport rolls 20 through the chamber 10 in a transport direction indicated by arrow 22. For providing and discharging the substrate(s) 30, the chamber 10 has an inlet and an outlet (both not shown), which may e.g. be formed as vacuum slit valves or vacuum load locks.

In the present embodiment, at a top wall 12 of chamber 10, a sputtering device 40 including a solid Cu target is provided as the coating device. The sputtering device 40 may utilize a magnetron system including a Cu target. In embodiments, rotary sputtering cathodes or planar sputtering cathodes can be used. The sputtering device 40 can be formed elongated perpendicular to the transport direction 22, such that the substrates 30 may be coated across their whole width.

In some embodiments, chamber 10 can further be provided with other devices, e.g. heaters for heating the substrate 30; and a gas pressure sensor.

Chamber 10 includes a gas supply 60 which is connected to a plurality of gas tanks 62, 64, and 66. In the present embodiment, the gas tanks 66 and 64 are filled with Ar, and $O_2$, respectively. The supply of gas from each gas tank 62, 64, and 66 can be controlled by a process control device 90 (indicated in FIG. 1 by broken lines) using a corresponding number of valves 68 installed between the respective gas tank and the chamber 10. The chamber 10 can be further provided with a sensor device (not shown) connected to the process control device, in order to monitor the position of the substrate 30. Thereby, the valves 62, 64, and 66 can be opened and closed in accordance to the position of the substrate 30, in order to provide the specific gas or gases needed for the consecutive process steps of sputtering and optional further process steps. The sputtering device 40 and the transport rolls 20 of the substrate support can also be controlled by the process control device.

In a further embodiment, the gas supply may be provided with only one gas tank containing a mixture of the specific gases needed for the sputtering process using sputtering device 40, the mixture having a suitable ratio of the specific gases. The flow rate of the gas mixture can be adjusted for providing the required sputtering atmosphere.

According to one embodiment of a method described herein referring to FIG. 1, a semiconductor device precursor, which is formed of glass, is provided as the substrate 30. The substrate 30 is fed into the chamber 10 shown in FIG. 1, positioned on the transport rolls 20 and conveyed along the transport direction 22. When substrate 30 is positioned below sputtering device 40, the transport rolls are stopped, and Ar gas and $O_2$ gas are fed into the chamber 10 in a vol % ratio of about 80/20 to about 95/5, by opening the valves 68 provided at gas tanks 66 and 64 and adjusting the Ar/$O_2$ flow rate. Thereby, a sputtering process gas pressure of about 0.1 Pa to about 0.3 Pa is provided. This can be accomplished by above mentioned sensor device and gas pressure sensor, which may also be connected to the process control device 90. The sensor device provides data reflecting the position of the substrate 30, while the process control device opens valve 68 and controls the pressure in chamber 10 and the operation of sputtering device 40. The substrate temperature can be adjusted to be in a range of about 25° C. to about 250° C. during deposition, e.g. using for high temperatures above mentioned heaters. The Cu target is bombarded with $Ar^+$ ions and Cu particles are released from the Cu target and ejected towards the substrate 30 in an $O_2$ containing atmosphere. Thereby, the surface of substrate 30, which is facing the sputtering device 40, is coated with an oxygen containing Cu layer by a static reactive magnetron sputtering. Hence, a barrier/adhesion layer of oxygen containing Cu is formed on the glass substrate. When a layer thickness of about 2 nm to 30 nm is deposited, the supply of $O_2$ gas is stopped by closing the valve 68 provided at gas tank 64. Sputtering of Cu particles is continued until a pure Cu layer having a thickness of about 200 nm to 500 nm is formed on the barrier/adhesion layer. As a result, a Cu metallization layer is formed, which, adjacent to the substrate, includes oxygen.

Above embodiment allows that the oxygen present in the sputtering atmosphere gives rise to an oxygen containing area or layer at the interface of the Cu metallization layer and the glass surface, thereby improving the adhesion of the metallization layer. In addition, sputtering of Cu in an atmosphere including $O_2$ and sputtering of pure Cu in an atmosphere without supply of $O_2$ can be performed in the same vacuum chamber. Furthermore, sputtering of Cu in an atmosphere including $O_2$ and sputtering of pure Cu in an atmosphere without $O_2$ can be accomplished just by stopping the supply of $O_2$. Further, sputtering of pure Cu in an atmosphere without supply of $O_2$ can be performed immediately after sputtering in an $O_2$ containing atmosphere, since a sputter cleaning of the targets of the sputtering device 40 is not required between these sputtering steps. Moreover, by controlling different process parameters, such as the power at the sputtering cathodes, the pressure of the Ar gas, and the composition and/or flow of the Ar/$O_2$ mixture, the Cu adhesion and thereby the adhesion of the metallization layer is improved. Moreover, reactivity of the Cu metallization material with subsequent PECVD, such as silicon nitride PECVD can be reduced or even prevented.

According to another embodiment, the above method described referring to FIG. 1, is performed using as the substrate 30 a semiconductor device precursor, which is coated with a semiconductor layer. Thereby, a Cu metallization is formed, which, adjacent to the semiconductor layer, includes oxygen. Hence, the Cu adhesion and thereby the adhesion of the metallization layer on the semiconductor layer is improved. In addition, interdiffusion of Cu and amorphous silicon of an adjacent Si layer, and reactivity of the Cu metallization material with subsequent PECVD, such as silicon nitride PECVD can be reduced or even prevented.

Figure 2:
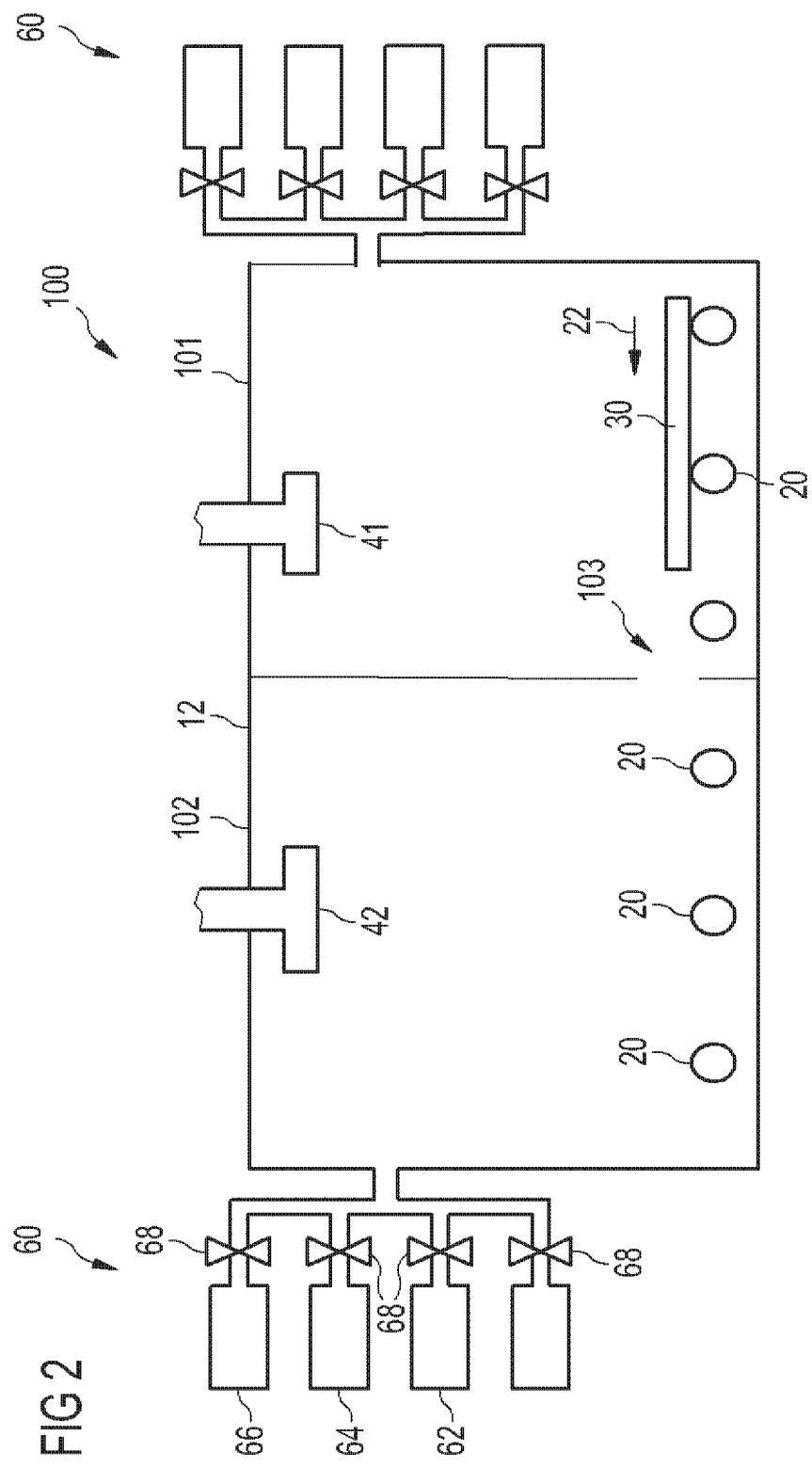
FIG. 2 schematically illustrates another embodiment of an installation for producing a semiconductor device.

In a further embodiment, which is described referring to FIG. 2, instead of chamber 10, a chamber 100 is provided, which includes two sub-chambers 101 and 102, each being provided with a sputtering device 41 and 42, respectively, and a gas supply 60. Each chamber 101, 102 can be further provided with a gas pressure sensor and a sensor device (not shown) connected to a process control device common to both chambers, in order to monitor the chamber pressure and the position of the substrate 30. Further, the sub-chambers of chamber 100 are vacuum tightly connected to each other by a vacuum slit valve 103 (not shown), the position of which is only schematically indicated in FIG. 2. Alternatively, the sub-chambers 101 and 102 can be connected via a transfer chamber. Each of the two sub-chambers, and optionally the transfer chamber, may be provided with a vacuum pump, such that they can be evacuated individually. In these embodiments, the sputtering device 41 and the sputtering device 42 are positioned in different sub-chambers and may be operated continuously and/or discontinuously while one or more substrates are provided facing the sputtering devices consecutively.

According to some examples, the installation of embodiments and/or the chambers 10 or 100, respectively, are or are parts of a modular manufacturing system, which may include a plurality of sub-chambers, which may be vacuum tightly connected to each other. The modular manufacturing system may further include at least one element chosen from: a layer patterning device e.g. including a resist coating device, a UV source, and an etching device; a PECVD device for producing semiconductor layers and/or dielectric layers, e.g. a-Si layers and/or SiN layers, and a further sputtering device.

In one embodiment, the arrangement shown in FIG. 2 has sputtering devices 41 and 42 which include targets of different metals, e.g. Cu in the target of sputtering device 41 and e.g. Al in the target of sputtering device 42. Therefore, a barrier/adhesion layer and a subsequent pure metal layer including different metals can be formed. According to a method using this embodiment, the substrate 30 is fed into the sub-chamber 101 shown in FIG. 2, positioned on the transport rolls 20 and conveyed along the transport direction 22. When substrate 30 is positioned below sputtering device 41, the transport rolls are stopped, and Ar gas and $O_2$ gas fed into the chamber 101 in a vol % ratio of about 80/20 to about 95/5, by opening the valves 68 provided at gas tanks 66 and 64 and adjusting the $Ar/O_2$ flow rate(s). Thereby, a sputtering process gas pressure of about 0.1 Pa to about 0.3 Pa is provided. This can be accomplished by above mentioned sensor device, gas pressure sensor and process control device. The sensor device provides data reflecting the position of the substrate 30 while the process control device opens valve 68 and controls the pressure and the operation of sputtering device 41. The substrate temperature can be adjusted to be in a range of about 25° C. to about 250° C. during deposition, e.g. using for high temperatures above mentioned heaters. The Cu target of sputtering device 41 is bombarded with $Ar^+$ ions and Cu particles are released from the Cu target and ejected towards the substrate 30 in an $O_2$ containing atmosphere. The surface of substrate 30 facing the sputtering device 40 is coated with an oxygen containing Cu layer by a static reactive magnetron sputtering. Thereby, a barrier/adhesion layer of oxygen containing Cu is formed on the substrate. When a layer thickness of about 2 nm to 30 nm has been deposited, the sputtering of Cu is stopped. Thereafter, coated substrate 30 is transported to a position below sputtering device 42 including an Al target. Then, a sputtering of Al particles onto the barrier/adhesion layer is performed until a pure Al layer having a thickness of about 200 nm to 500 nm is formed on the barrier/adhesion layer. As a result, an Al/Cu metallization is formed, which, in the Cu layer adjacent to the substrate, includes oxygen. In a variation of above embodiment described referring to FIG. 2, the sputtering device 42 includes a Cu target instead of an Al target. Hence, a Cu metallization layer is formed having a Cu containing area or a CuO layer adjacent to the substrate 30 and a Cu layer above the Cu containing area or CuO layer. Hence, a Cu containing area or a CuO layer is provided between a Cu layer and the substrate 30. As a result, a Cu metallization layer is formed, which, adjacent to the substrate, includes oxygen.

In a variation of the embodiment described referring to FIG. 2, the substrate 30 can be transported continuously below sputtering devices 41 and 42, in order to form the stack of the barrier/adhesion layer and the pure metal layer by a dynamic magnetron sputtering process. In another variation of the embodiment described referring to FIG. 2, the Al layer can be formed using a coating process other than sputtering.

A further embodiment, which can be combined with any other embodiment described herein, differs from above embodiments described referring to FIG. 1 in that the supply of Ar gas and $O_2$ gas, which are used during operation of the sputtering device 40 is stopped and Ar, $O_2$ and other residual gases are evacuated from chamber 10 previous to the subsequent sputtering of Cu without $O_2$. Thereby, a clean atmosphere is established between two sputtering steps. In order to initiate the second sputtering step, the Ar supply can be resumed.

According to further variations of the embodiments described referring to FIGS. 1 and 2, chamber 10 or chamber 100, respectively, includes additional devices (not shown) for treating the semiconductor device precursor. In an alternative embodiment of a method of producing a semiconductor device, deposition of each metallization layer can be performed in chamber 10, as shown in FIG. 1, and each patterning of the metallization layer can be performed after the semiconductor device precursor has been discharged from chamber 10. As used herein, "patterning" refers to shaping a deposited layer of material to have a desired form and dimensions, using, for example, photolithography or other methods for selectively shaping a layer, such as planarization and selective etching techniques.

Figure 3:
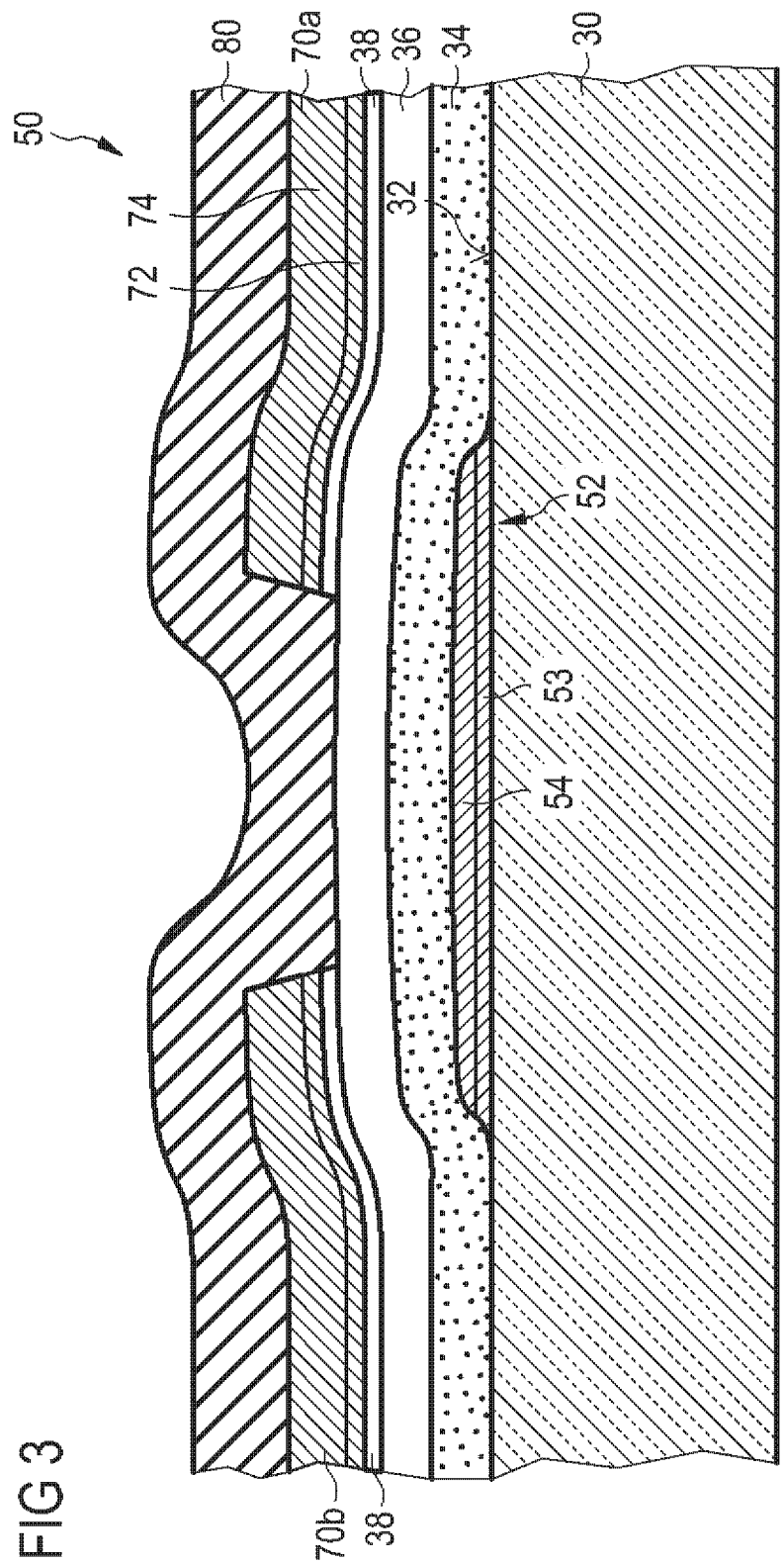
FIG. 3 schematically illustrates an embodiment of a semiconductor device.

In an example of a method according to embodiments, a TFT 50 as shown in FIG. 3 is fabricated in a modular manufacturing system including chamber 10 as shown in FIG. 1 and including in other chambers or sub-chambers one or more PECVD devices and one or more pattering devices (not shown). At first, as substrate 30 a glass substrate is provided on the substrate support of chamber 10 including rolls 20 and transported along transport direction 22. Then, a Cu gate metallization layer 52 including a barrier/adhesion layer 53 and a metal layer 54 is deposited on an upper surface 32 of the glass substrate 30 using sputtering device 40 and the embodiment of the method described above referring to FIG. 1. After metallization layer 52 has been deposited on glass substrate 30, the metallization material is patterned in another chamber of the modular manufacturing system, in order to form a gate metallization 52 as shown in FIG. 3. Here, "patterned" refers to shaping a deposited layer of material to have a desired form and dimensions, using, for example, selective etching techniques which can be performed in another chamber of the modular manufacturing system. A gate dielectric layer 34 is then deposited over gate metallization 52 and the exposed portions of upper substrate surface 32. A gate dielectric layer typically includes silicon nitride (SiN or $SiN_x$) or silicon oxide (SiO or $SiO_y$) and is deposited to a thickness between about 20 nm and 300 nm. Gate dielectric layer 34 is in the present example deposited by plasma enhanced chemical vapor deposition (PECVD), e.g. using as process gases $SiH_4$ and $NH_3$, resulting in a $SiN_x$ layer. Typically, $SiN_x$ of a gate dielectric layer is deposited at a substrate temperature of about 340° C. to about 350° C.

An amorphous silicon layer (or semiconductor layer) 36 is then deposited over gate dielectric layer 34, in the present example by PECVD. Amorphous silicon layer 36 includes for instance substantially hydrogenated intrinsic amorphous silicon, e.g. a-Si:H, and is deposited to a thickness of between about 20 nm and 300 nm. In the present embodiment, a layer of n+ doped amorphous silicon 38, e.g. $n^+$ a-Si:H, is formed on the amorphous silicon layer 36. As used herein, n+ doped silicon refers to silicon which has been doped to exhibit n+ type conductivity. The semiconductor device precursor coated with layers 52, 34, 36 and 38 is then provided again in chamber 10. A layer 70 of source/drain metallization including a barrier/adhesion layer 72 and a metal layer 74 is then deposited over the n+ Si layer 38 of the semiconductor device precursor. To this end, sputtering device 40 of chamber 10 is used for performing the embodiment of the method described above referring to FIG. 1, wherein the n+ Si layer coated semiconductor device precursor is provided as the substrate 30. Then, the source/drain metallization layer 70 is patterned in another chamber of the modular manufacturing system, in order to form a source electrode 70a and a drain electrode 70b. The orientation of the source and the drain electrode in FIG. 3 is arbitrary; dependent on device arrangement, either electrode can serve as the source or the drain. Patterning of source and drain electrodes 70a, 70b typically includes removing a portion of metallization layer 70 and of underlying n+ doped Si layer 38. This removal is performed in the vicinity of gate metallization 52 such that the amorphous silicon semiconductor 38 layer remains between the respective source and drain electrodes. A passivation dielectric layer 80, such as silicon nitride or silicon oxide, can be deposited to a thickness of between about 100 nm and 1000 nm over the completed TFT, e.g. by PECVD. For instance, in order to deposit passivation dielectric layer 80 by a PECVD process, SiH$_4$ and NH$_3$ can be used as process gases, resulting in a SiN$_x$ layer. In this case, SiN$_x$ is typically deposited at a substrate temperature of about 280° C. to about 290° C.

Because of the metallization layers 52 and 70 having an oxygen containing layer adjacent to the substrate 30 and the Si layer 38, respectively, TFT 50 has an improved adhesion of the Cu metallization 52, 70a and 70b on the glass substrate 30 and on the amorphous Si layer 38. Further, interdiffusion of the Cu metallization material and the adjacent amorphous Si layers 38 and 36 can be avoided. In addition, a reactivity of the Cu metallization material and materials and/or gases of PECVD processes, e.g. performed for deposition of the Si containing layers 34, 36, 38 and/or 80, is reduced or even prevented. These effects are achieved by providing a metallization layer which, adjacent to both the substrate and the Si containing layers, includes oxygen or a barrier/adhesion layer which contains oxygen.

One embodiment provides a method of producing a semiconductor device including a substrate, a semiconductor layer, and at least one metallization layer adjacent to at least one element chosen from the substrate and the semiconductor layer, the method including forming at least one metallization layer which, adjacent to at least one element chosen from the substrate and the semiconductor layer, includes oxygen.

In one embodiment, a method of producing a semiconductor device including a substrate, a semiconductor layer, and at least one metallization layer adjacent to at least one element chosen from the substrate and the semiconductor layer is provided, including forming the at least one metallization layer by at least one step chosen from: forming an oxygen containing barrier/adhesion layer adjacent to at least one element being chosen from the substrate and the semiconductor layer; and forming a metal layer adjacent to the barrier/adhesion layer; the barrier/adhesion layer and the metal layer including at least one metal.

In one embodiment, which can be combined with any other embodiment described herein, a step of forming the at least one metallization layer includes at least one step chosen from: forming an oxygen containing barrier/adhesion layer adjacent to at least one element being chosen from the substrate and the semiconductor layer; and forming a metal layer adjacent to the barrier/adhesion layer; the barrier/adhesion layer and the metal layer including at least one metal.

In one embodiment, which can be combined with any other embodiment described herein, the semiconductor device is at least one element chosen from: a TFT, a bottom-gate TFT, a top-gate TFT, a staggered TFT, a coplanar TFT, and a TFT having an Etch Stopper Layer structure.

One embodiment, which can be combined with any other embodiment described herein, provides a method of producing a semiconductor device including: providing a semiconductor device precursor having a surface; a step including supplying an oxygen containing gas into the chamber and sputtering a first metallization material towards the surface; and a step including terminating the supply of oxygen containing gas and sputtering a second metallization material towards the surface.

In one embodiment, which can be combined with any other embodiment described herein, the surface of the semiconductor device precursor is chosen from a surface of a substrate, a surface of a semiconductor layer, and a surface of a dielectric layer. In one embodiment, which can be combined with any other embodiment described herein, the surface of the semiconductor device precursor is chosen from a substrate surface, a semiconductor surface, and a dielectric surface. In one embodiment, which can be combined with any other embodiment described herein, the first metallization material and the second metallization material are identical. In one embodiment, which can be combined with any other embodiment described herein, at least one element chosen from the first metallization material and the second metallization material are chosen from: a metal, a refractory metal, and Cu.

In one embodiment, which can be combined with any other embodiment described herein, at least one element is formed chosen from: a metallization layer including a stack including a metal layer and a barrier/adhesion layer; the metal layer substantially consisting of at least one metal; and the barrier/adhesion layer being adjacent to at least one element chosen from a substrate of the semiconductor device precursor and a semiconductor layer of the semiconductor device precursor and including oxygen.

In one embodiment, which can be combined with any other embodiment described herein, a metallization layer is formed by the step including supplying oxygen containing gas into the chamber and sputtering a first metallization material towards the surface, and the step including terminating the supply of oxygen containing gas and sputtering a second metallization material towards the surface.

In one embodiment, which can be combined with any other embodiment described herein, a barrier/adhesion layer is formed by the step including supplying oxygen containing gas into the chamber and sputtering a first metallization material towards the surface.

In one embodiment, which can be combined with any other embodiment described herein, a metal layer is formed by the step including terminating the supply of oxygen containing gas and sputtering a second metallization material towards the surface.

In one embodiment, which can be combined with any other embodiment described herein, at least one step is included chosen from: forming at least one element chosen from a dielectric layer and a dielectric layer provided adjacent to the metallization layer; forming a semiconductor layer; and patterning a stack of the first and the second metallization materials deposited on the surface.

In one embodiment, which can be combined with any other embodiment described herein, the sputtering is performed in a sputtering process gas including an inert gas, e.g. Ar. As described herein, a sputtering process gas may be referred to as sputtering atmosphere.

In one embodiment, which can be combined with any other embodiment described herein, the oxygen containing gas includes O$_2$.

In one embodiment, which can be combined with any other embodiment described herein, at least one step is included chosen from: forming the barrier/adhesion layer having a thickness of 2 nm to 30 nm; and forming the metal layer having a thickness of 200 nm to 500 nm.

In one embodiment, which can be combined with any other embodiment described herein, the sputtering is performed using at least one process condition chosen from: a sputtering cathode power of 2.5 W/cm$^2$ to 50 W/cm$^2$, a pressure of a sputtering process gas of 0.1 Pa to 0.3 Pa, and a mixture of an inert gas and the oxygen containing gas having a ratio of 80/20 to 95/5. The ratio can be a vol % ratio of the inert gas and the oxygen containing gas. A mixture of the inert gas and the oxygen containing gas, which includes more than 20% oxygen may be contemplated, but is not used according to some embodiments, in order to limit the amount of oxygen in the exhaust of the vacuum pumps. Further, in case of planar sputtering cathodes including Cu targets, power densities of more than 80 W/cm$^2$ can be used.

In one embodiment, which can be combined with any other embodiment described herein, the substrate is chosen from at least one element chosen from a transparent substrate and a glass substrate. In one embodiment, which can be combined with any other embodiment described herein, at least one element chosen from the metallization layer, the metal layer and the adhesion/barrier layer is formed containing at least one element chosen from a refractory metal, and Cu.

In one embodiment, which can be combined with any other embodiment described herein, the semiconductor layer includes at least one element chosen from a doped semiconductor, an amorphous semiconductor, Si, GaAs, a-Si, n$^+$ doped a-Si, a-Si:H, and n$^+$ doped a-Si:H. In one embodiment, which can be combined with any other embodiment described herein, the dielectric layer includes at least one element chosen from a semiconductor compound, a Si compound, SiN and SiO.

In one embodiment, which can be combined with any other embodiment described herein, at least one element chosen from the semiconductor layer and dielectric layer is formed by at least one process chosen from CVD and PECVD.

In one embodiment, which can be combined with any other embodiment described herein, at least one step is included chosen from: providing at least one metallization layer on at least one element chosen from the substrate and the semiconductor layer; forming one metallization layer on the substrate and another metallization layer on the semiconductor layer; providing a metallization layer as gate metallization; providing a metallization layer as source metallization; and providing a metallization layer as drain metallization.

One embodiment, which can be combined with any other embodiment described herein, includes providing the barrier/adhesion layer between the metal layer and at least one element chosen from the substrate and the semiconductor layer.

In one embodiment, which can be combined with any other embodiment described herein, the semiconductor device is at least one element chosen from: a TFT, a bottom-gate TFT, a top-gate TFT, a staggered TFT, a coplanar TFT, and a TFT having an Etch Stopper Layer structure.

According to a further embodiment, a semiconductor device includes a substrate, a semiconductor layer, and at least one metallization layer adjacent to at least one element chosen from the substrate and the semiconductor layer, wherein, adjacent to at least one element chosen from the substrate and the semiconductor layer, one or more of the at least one metallization layers includes oxygen.

According to a further embodiment, a semiconductor device is obtainable or obtained by a method of producing a semiconductor device, the method including: providing a semiconductor device precursor having a surface; a step including supplying an oxygen containing gas into the chamber and sputtering a first metallization material towards the surface; and a step including terminating the supply of oxygen containing gas and sputtering a second metallization material towards the surface According to a further embodiment, an installation for producing a semiconductor device includes a chamber; wherein the chamber includes a coating device adapted to perform a method of producing a semiconductor device including a substrate, a semiconductor layer, and at least one metallization layer adjacent to at least one element chosen from the substrate and the semiconductor layer, the method including forming at least one metallization layer which, adjacent to at least one element chosen from the substrate and the semiconductor layer, includes oxygen.

According to a yet further embodiment, an installation for producing a semiconductor device, includes a chamber; wherein the chamber includes a coating device adapted to perform a method of producing a semiconductor device, the method including: providing a semiconductor device precursor having a surface; a step including supplying an oxygen containing gas into the chamber and sputtering a first metallization material towards the surface; and a step including terminating the supply of oxygen containing gas and sputtering a second metallization material towards the surface.

In one embodiment, which can be combined with any other embodiment described herein, at least one element is included chosen from: a sputtering device adapted to eject a metallization material and a supply of an oxygen containing gas, the sputtering device and the supply of an oxygen containing gas being included in the coating device; a substrate support included in the chamber and facing at least one element chosen from the coating device and the sputtering device; and a control device adapted to perform the method.

The written description uses examples to disclose the invention, including the best mode, and also to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other. The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

The invention claimed is:

1. A method of producing a semiconductor device comprising a substrate, a semiconductor layer, and at least one metallization layer adjacent to at least one element chosen from the substrate and the semiconductor layer, the method comprising:
    positioning a substrate into a processing chamber having a sputtering target;
    forming the at least one metallization layer including an oxygen concentration gradient on the substrate by:
        forming a barrier/adhesion layer having a thickness of 2 nm to 30 nm by supplying an oxygen containing gas into the processing chamber and sputtering a first metallization material from the sputtering target onto the substrate; and
        sequentially forming a metal layer by terminating the supply of oxygen containing gas and sputtering a second metallization material from the sputtering target onto the substrate without removing the substrate from the processing chamber.

2. The method of claim 1, wherein forming the at least one metallization layer comprises at least one of:
    forming an oxygen containing barrier/adhesion layer adjacent to at least one element being chosen from the substrate and the semiconductor layer; and
    forming a metal layer adjacent to the barrier/adhesion layer;
    the barrier/adhesion layer and the metal layer including at least one metal.

3. The method of claim 1, wherein the semiconductor device is at least one element chosen from: a TFT, a bottom-gate TFT, a top-gate TFT, a staggered TFT, a coplanar TFT, and a TFT having an Etch Stopper Layer structure.

4. A method of producing a semiconductor device, comprising:
  positioning a semiconductor device precursor having a surface into a processing chamber having a sputtering target;
  forming a metallization layer including an oxygen concentration gradient by:
  forming a barrier/adhesion layer having a thickness of 2 nm to 30 nm by supplying an oxygen containing gas into the processing chamber and sputtering a first metallization material from the sputtering target towards the surface; and
  sequentially forming a metal layer by terminating the supply of oxygen containing gas and sputtering a second metallization material from the sputtering target towards the surface without removing the substrate from the processing chamber.

5. The method of claim 4, wherein the surface of the semiconductor device precursor being chosen from a surface of a substrate, a surface of a semiconductor layer, a surface of a dielectric layer, a semiconductor surface, and a dielectric surface.

6. The method of claim 4, wherein the semiconductor device further comprises:
  the metallization layer including a stack comprising the metal layer and the barrier/adhesion layer;
  the metal layer substantially consisting of at least one metal; and
  the barrier/adhesion layer being adjacent to at least one of a substrate of the semiconductor device precursor and a semiconductor layer of the semiconductor device precursor and including oxygen.

7. The method of claim 4, wherein the method further comprises at least one of:
  forming a dielectric layer adjacent to the metallization layer;
  forming a semiconductor layer; and
  patterning a stack of the first and the second metallization materials, the stack being deposited on the surface.

8. The method of claim 4, wherein at least one of the sputtering is performed in a sputtering process gas including an inert gas.

9. The method of claim 4, wherein the oxygen containing gas comprises $O_2$.

10. The method of claim 6, comprising forming the metal layer having a thickness of 200 nm to 500 nm.

11. The method of claim 4, wherein at least one of the sputtering is performed using at least one process condition chosen from:
  a sputtering cathode power of 2.5 $W/cm^2$ to 50 $W/cm^2$,
  a pressure of a sputtering process gas of 0.1 Pa to 0.3 Pa, and
  a mixture of an inert gas and the oxygen containing gas having a ratio of 80/20 to 95/5.

12. The method of claim 6, comprising at least one chosen from:
  the substrate being chosen from at least one of a transparent substrate and a glass substrate; and
  at least one of the metallization layer, the metal layer and the adhesion/barrier layer being formed containing at least one of a refractory metal, and Cu.

13. The method of claim 7, comprising at least one chosen from:
  the semiconductor layer comprising at least one of a doped semiconductor, an amorphous semiconductor, Si, GaAs, a-Si, $n^+$doped a-Si, a-Si:H, and $n^+$doped a-Si:H; and
  the dielectric layer comprising at least one of a semiconductor compound, a Si compound, SiN and SiO.

14. The method of claim 7, wherein at least one chosen from the semiconductor layer and dielectric layer is formed by at least one process chosen from CVD and PECVD.

15. The method of claim 5, comprising at least one of:
  providing at least one metallization layer on at least one of the substrate and the semiconductor layer;
  forming one metallization layer on the substrate and another metallization layer on the semiconductor layer;
  providing a metallization layer as gate metallization;
  providing a metallization layer as source metallization; and
  providing a metallization layer as drain metallization.

16. The method of claim 6, comprising providing the barrier/adhesion layer between the metal layer and at least one chosen from the substrate and the semiconductor layer.

17. The method of claim 4, wherein the semiconductor device comprises at least one of a TFT, a bottom-gate TFT, a top-gate TFT, a staggered TFT, a coplanar TFT, and a TFT having an Etch Stopper Layer structure.

18. The method of claim 4, wherein the first metallization material and the second metallization material are the same.

19. The method of claim 4, wherein the first metallization material and the second metallization material are each selected from a metal, a refractory metal, and Cu.

* * * * *